(12) United States Patent
Obbalareddi Demudu et al.

(10) Patent No.: US 11,047,892 B2
(45) Date of Patent: Jun. 29, 2021

(54) METHOD AND SYSTEM FOR LOCATING A FAULT IN A MIXED POWER TRANSMISSION LINE

(71) Applicant: ABB Power Grids Switzerland AG, Baden (CH)

(72) Inventors: Naidu Obbalareddi Demudu, Bangalore (IN); Amit Purohit, Indore (IN); Sachin Srivastava, Bangalore (IN); Jianping Wang, Vasteras (SE)

(73) Assignee: ABB Power Grids Switzerland AG, Baden (CH)

( * ) Notice: Subject to any disclaimer, the term of this patent is extended or adjusted under 35 U.S.C. 154(b) by 63 days.

(21) Appl. No.: 16/315,665

(22) PCT Filed: Jul. 8, 2016

(86) PCT No.: PCT/IB2016/054112
§ 371 (c)(1),
(2) Date: Jan. 7, 2019

(87) PCT Pub. No.: WO2018/007857
PCT Pub. Date: Jan. 11, 2018

(65) Prior Publication Data
US 2019/0391191 A1 Dec. 26, 2019

(51) Int. Cl.
*G01R 27/16* (2006.01)
*G01R 31/08* (2020.01)
*H02H 7/26* (2006.01)

(52) U.S. Cl.
CPC .......... *G01R 27/16* (2013.01); *G01R 31/085* (2013.01); *G01R 31/088* (2013.01); *H02H 7/265* (2013.01)

(58) Field of Classification Search
CPC .... G01R 31/088; G01R 27/16; G01R 31/085; G01R 31/11; H02H 7/265; H02H 1/0007;
(Continued)

(56) References Cited

U.S. PATENT DOCUMENTS

| 4,766,549 A | 8/1988 | Schweitzer, III et al. |
| 5,206,595 A | 4/1993 | Wiggins et al. |

(Continued)

FOREIGN PATENT DOCUMENTS

| CN | 103901324 A | 7/2014 |
| CN | 105223471 A | 1/2016 |
| WO | 2013/071974 A1 | 5/2013 |

OTHER PUBLICATIONS

Han Junyu et al: "Fault location on mixed overhead line and cable transmission networks", (Year: 2013).*
Dong Xinzhou et al., "Optimizing Solution of Fault Location," 2002 IEEE Power Engineering Society, Summer Meeting, Conference Proceedings, Chicago, IL, Jul. 21-25, 2002; [IEEE Power Engineering Society], New York, NY, IEEE, US Jul. 25, 2002, p. 1113, XP031212755, ISBN: 978-0-7803-7518-5.
(Continued)

*Primary Examiner* — Lee E Rodak
*Assistant Examiner* — Brent J Andrews
(74) *Attorney, Agent, or Firm* — Slater Matsil, LLP (57) ABSTRACT

A method and system is provided for locating a fault in a mixed power transmission line. The method is implemented by an Intelligent Electronic Device (IED) of the mixed line. The IED detects a travelling wave from one or more signals received from one or more measurement equipment. Thereafter, the IED identifies a line section with the fault, and generates two or more estimates for the location of the fault based on a time difference between arrival of two peaks of the travelling wave, a velocity of propagation of the travelling wave in the line section identified with the fault, and a length of one or more line sections. The IED determines the location of the fault based on a comparison of each estimate with a threshold, wherein the threshold is estimated based on the one or more signals, equivalent source impedance of each source and total line impedance.

20 Claims, 6 Drawing Sheets

(58) Field of Classification Search
CPC .. H02H 3/02; H02H 3/30; H02H 7/26; H02H 7/263
See application file for complete search history.

(56) References Cited

U.S. PATENT DOCUMENTS

| | | |
|---|---|---|
| 5,272,439 A | 12/1993 | Mashikian et al. |
| 2002/0161539 A1 | 10/2002 | Jones et al. |
| 2004/0153264 A1 | 8/2004 | Teich et al. |
| 2006/0012374 A1 | 1/2006 | Kojovic et al. |
| 2012/0146666 A1 | 6/2012 | Bottman et al. |
| 2013/0096854 A1 | 4/2013 | Schweitzer, III et al. |
| 2013/0204555 A1* | 8/2013 | Scheuschner .......... G01R 23/16 702/59 |
| 2015/0081234 A1* | 3/2015 | Schweitzer, III .... G01R 31/088 702/58 |
| 2015/0081236 A1 | 3/2015 | Schweitzer, III et al. |
| 2015/0212025 A1 | 7/2015 | Francis-Buller et al. |
| 2016/0327604 A1 | 11/2016 | Ioana |
| 2017/0102426 A1 | 4/2017 | Schweitzer, III et al. |
| 2017/0110875 A1 | 4/2017 | Schweitzer, III et al. |
| 2018/0059164 A1 | 3/2018 | Cohen et al. |
| 2018/0136269 A1 | 5/2018 | Schweitzer, III et al. |
| 2018/0372789 A1 | 12/2018 | King |
| 2019/0079131 A1 | 3/2019 | Pinhasi et al. |
| 2019/0212382 A1 | 7/2019 | Guzman-Casillas et al. |

OTHER PUBLICATIONS

Livani, H.; Evrenosoglu, C.Y. "A Machine Learning and Wavelet-Based Fault Location Method for Hybrid Transmission Lines", Smart Grid, IEEE Transactions on, On pp. 51-59 vol. 5, Issue: 1, Jan. 2014.

Livani. H., Evrenosoglu, C.Y. "A hybrid fault location method for overhead lines combined with underground cables using DWT and SVM", Power and Energy Society General Meeting, 2012 IEEE, On pp. 1-6.

Livani. H., Evrenosoglu, C.Y. "A traveling wave based single-ended fault location algorithm using DWT for overhead lines combined with underground cables" power and energy society general meeting, 2010 IEEE, on pp. 1-6.

Cigre Working Group B5.23—Technical Brochure "Short circuit protection of circuits with mixed conductor technologies in transmission networks" Jun. 2014.

Han Junyu et al., "Fault Location on Mixed Overhead Line and Cable Transmission Networks," 2013 IEEE Grenoble Conference, IEEE, Jun. 16, 2013, pp. 1-6, XP032519795, doi: 10.1109/PTC.2013.6652311.

International Preliminary Report on Patentability for International Application No. PCT/IB2016/054112, dated Jan. 8, 2019, 8 pages.

International Search Report for International Application No. PCT/IB2016/054112, dated Apr. 10, 2017, 4 pages.

* cited by examiner

METHOD AND SYSTEM FOR LOCATING A FAULT IN A MIXED POWER TRANSMISSION LINE

CROSS REFERENCE TO RELATED APPLICATIONS

The present application is a national stage entry under 35 USC § 371 of International Application No. PCT/IB2016/054112, filed Jul. 8, 2016.

FIELD OF THE INVENTION

The present invention relates to locating faults in a mixed power transmission line.

BACKGROUND OF THE INVENTION

A mixed power transmission line (mixed line) is a transmission line with non-uniform line impedance characteristics. In other words, a mixed line has at least two line sections, wherein impedance characteristic (e.g. surge impedance) of one section is different from impedance characteristic of the other section(s). Such a transmission line is preferred over a homogenous transmission line (i.e. a line with only one impedance characteristic) for a variety of reasons including, but not limited to, safety considerations, ease of accessibility of substations in thickly populated locations, ease of grid connection between countries with varying topology, and need for subsea electrification. An example where a mixed power transmission line is preferred instead of a homogenous transmission line, is when the transmission line is expected to traverse across natural vegetation, rivers etc.

Accurate fault location in mixed lines is very important for maintenance crew to reach to a faulted section and undertake repair work quickly. Fault location in a mixed line is challenging due to variance in surge impedances or impedance characteristics (e.g. X/R ratio). Faults near to junctions increase the problem multifold due to different electromagnetic wave propagation characteristics.

Fault location methods are classified into single ended or two ended, based on the availability of input quantities. Further, according to the fault location principle used, these methods are also categorized as impedance based methods or traveling wave based methods.

An impedance based fault location method typically uses post fault relay measured impedance. The impedance from the relay location to fault point is calculated using the voltage and current measurements. The fault location in the impedance method is calculated using the ratio of relay measured impedance and line impedance. Traditional impedance based methods may not give accurate results for mixed/non-homogeneous lines due to the varying impedance characteristics of the different line sections.

Two end synchronous measurement based traveling wave fault location methods are generally known. Communication based solutions are typically considered more accurate and reliable for impedance or traveling wave based methods. However, the reliability and quality of a communication channel is still a major challenge. In addition, accurate synchronized sampling and transferring of data at both sides is an increased complexity with these communication based solutions. Hence, single ended methods are generally preferred over communication based solution.

Thus, there is a need for an improved method and system for locating a fault in a mixed power transmission line.

SUMMARY OF THE INVENTION

Various aspects of the present invention provide a method and system for locating a fault in a mixed power transmission line (hereafter referred to a 'mixed line'). A mixed line is a transmission line with non-uniform line impedance characteristics. In other words, a mixed line has two or more line sections (or sections), wherein impedance characteristic (e.g. surge impedance) of at least a first line section is different from impedance characteristic of at least a second line section(s). For example, the mixed line can have two line sections, with one of the two sections being an overhead line section, and the other section being a cable section. Every two consecutive sections of the mixed line are connected at a junction. Accordingly, in case of a mixed line with two sections, there is one junction, and in case of a mixed line with three sections, there are two junctions and so forth.

The method is implemented by an Intelligent Electronic Device (IED) for the mixed line. For example, the method may be implemented by an IED associated with one of a line section, a junction, a substation etc. The IED receives one or more signals from one or more measurement equipment connected to the mixed line. For example, the measurement equipment can include a current transformer, a potential transformer, a sensor-based measurement equipment (e.g. Rogowski coils, non-conventional instrument transformers etc.) and/or the like, which provides a signal corresponding to current, voltage or other information as sensed from the mixed line. For example, a current transformer provides single/multiple phase current signal and a potential transformer can provide single/multiple phase voltage signal to the IED.

The IED may detect a travelling wave from the one or more signals received from the one or more measurement equipment. For example, a current signal may be digitized and processed by the IED to detect a travelling wave. The travelling wave is generated due to the fault or any other disturbance in any line section of the mixed line.

The IED performs the step of identifying a line section with the fault after detecting the travelling wave. The line section with the fault is identified from the one or more signals received from the one or more measurement equipment. For instance, the IED may identify that a particular line section (e.g. first line section) has a fault based on a current/voltage signal.

In one embodiment, the IED identifies the line section with the fault based on a comparison of a characteristic of the travelling wave with a corresponding threshold value. For instance, the IED may determine a first peak of the travelling wave and at least one of a peak width, a rise time and a discharge time of the first peak. Further, the IED may compare at least one of the peak width, the rise time and the discharge time with a corresponding threshold value of each junction. Here the corresponding threshold value(s) is predetermined for each junction and is stored in the IED.

According to the line section identified with the fault, the IED generates two or more estimates of the location of the fault. Here, a first estimate of the two or more estimates may correspond to a first half of the line section with the fault, while a second estimate of the two or more estimates may correspond to a second half of the line section with the fault.

Each estimate is generated based on a time difference between arrival of two peaks of the travelling wave, a velocity of propagation of the travelling wave in the line section identified with the fault, and a length of one or more line sections of the two or more line sections. For example, if the IED detects that the fault is in the first line section, then an estimate 'd1' can be obtained from the following equation:

$$d1 = \frac{(T_{M2} - T_{M1}) \times v_1}{2},$$

wherein, d1 is the first estimate, $T_{M2}-T_{M1}$ is the time difference between arrival of the first and the second peaks, and $v_1$ is the velocity of propagation of the travelling wave in the first line section. Similarly, the IED obtains another estimate d2 using:

$$d2 = L_1 - \frac{(T_{M2} - T_{M1}) \times v_1}{2},$$

wherein, d2 is the second estimate and L1 is the length of the first line section.

The IED determines the location of the fault based on a comparison of each estimate with a threshold for the location of the fault. For instance, the IED can select an estimate of the two or more estimates as the location of the fault based on the comparison of each estimate with the threshold. The threshold for the location of the fault is estimated based on the one or more signals, equivalent source impedance of each source of the mixed line, and total line impedance of the mixed line. For example, the threshold may be estimated based on voltage and current measurements along with line and source impedances. Also, the threshold for the location of the fault can be a single value, or a range of values for the location of the fault.

BRIEF DESCRIPTION OF DRAWINGS

The subject matter of the invention will be explained in more detail in the following text with reference to exemplary embodiments which are illustrated in attached drawings in which.

DETAILED DESCRIPTION

The present invention provides a system and method for locating a fault in a mixed power transmission line (referred to as 'mixed line' hereafter). The mixed line typically includes at least two line sections (or sections) having different impedance characteristics (for example different surge impedances). Every two consecutive line sections in a mixed line are connected at a junction.

Figure 1:
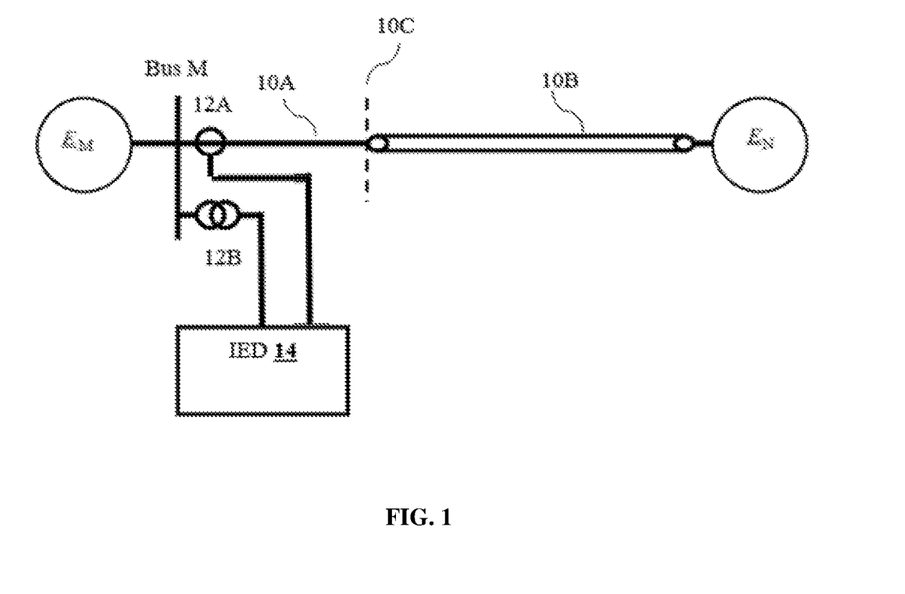
FIG. 1 is a simplified diagram of a system for locating a fault in a mixed power transmission line.

A mixed line is illustrated in FIG. 1, which includes one overhead line section (overhead section) denoted by a reference numeral 10A, and one cable section denoted by a reference numeral 10B. Further, the overhead section 10A is connected to the cable section 10B at a junction 10C. The mixed line connects two substations $E_N$ and $E_M$, in the embodiment illustrated in FIG. 1. The overhead section 10A originates at the substation $E_M$ and the cable section 10B terminates at the substation $E_N$ as shown in FIG. 1. Measurement equipment may be connected at one or more of the substations $E_M$ and $E_N$. The measurement equipment may be a Current Transformer (CT), a Potential Transformer (PT), capacitance coupled voltage transformer (CVT), a sensor-based measurement equipment etc.

In accordance with the embodiment shown in FIG. 1, the measurement equipment includes a current transformer 12A and a voltage transformer 12B, and an Intelligent Electronic Device (IED) 14 is connected to voltage transformer 12B and current transformer 12A. It would be apparent that IED 14 may be connected with the current transformer, or it may receive a signal from other equipment, or from different type of equipment (e.g. from both current and voltage transformers). Also, IED 14 may be connected at a line section, junction or other location.

When a fault (or disturbance) occurs at any line section of the mixed line, travelling waves are generated. In order to detect travelling waves, the signal(s) from the measurement equipment are monitored, preferably continuously. For example, IED 14 monitors the signal received from either the current transformer 12A or potential transformer 12B (depending upon whether current signals are to be sensed or voltage signals are to be sensed). The measurements corresponds to the point in the mixed line, wherein the measurement equipment is connected. In case of A/C line, the measurement will reflect current/voltage for each phase (of the multi-phase line). It should be noted that the method is not restricted to an A/C line, and can be implemented for a D/C line.

The signal(s) is digitized and processed by the IED 14, to detect a travelling wave therefrom. For example, at the IED 14, Clark transformation may be applied either to the current signal or the voltage signal. Subsequently aerial mode (alpha component or beta component) and ground mode components of the (current or voltage) signal are obtained. The alpha component or beta component is input for signal processing, to filter out unwanted noise, and extract the travelling waves within a predetermined frequency band. This process can be applied for a single phase, or repeated for each phase in a multi-phase line. Accordingly, the IED can implement the method for single phase A/C line as well as multi-phase A/C line. Also, the IED can similarly implement the method for a D/C line.

The IED 14 identifies a section to have a fault after detecting the travelling wave. The IED may identify the line section with the fault based on comparison of a travelling wave characteristic, with a corresponding threshold value. For this, the IED 14 may determine different travelling wave characteristics such as peak width, rise time and discharge time etc. Subsequently, the IED compares the travelling wave characteristic (e.g. peak width of the first peak), with the corresponding threshold value (e.g. threshold for peak width of junction 10C).

The threshold values for peak width, rise time and discharge time may be predetermined for the junction 10C (or multiple junctions as the case may be) and are stored in the IED. The threshold values may have been estimated based on analysis of a fault history and/or electrical characteristics of the mixed line. Fault characteristics of a junction(s) of the mixed line may be determined at the time of installation of the mixed line, and such characteristics may be used for defining the threshold value(s) for the junction. For an existing mixed line, experiments may be conducted for determining the threshold value(s) for the junction. Such experiments can include physically/virtually simulating faults for a line.

In case of a mixed line with multiple sections, the travelling wave characteristic (i.e. value of one of peak width, rise time, discharge time etc.) is compared with the threshold values for the different junctions. The section with the fault may be identified to be the section that precedes the junction for which the peak characteristic value exceeds the threshold value. Take a case of a line with junctions j1, j2, jn, wherein tpd1, trt1, tdt1, tpd2, trt2, tdt2, . . . tpdn, trtn, tdtn represents the threshold values of peak width, rise time and discharge time for j1, j2 . . . jn respectively. Here, the first peak characteristic (say PDf is compared with tpd1, tpd2 . . . tpdn). Assume that PDf<tp2 and PDf>tp3. Accordingly, IED 14 identifies that the fault is in the third section that lies between j2 and j3. It will be apparent that there may be different ways in which the threshold values may be used for comparing with the actual values and identifying the line section with the fault.

The IED 14 can also identify which half of a section (line section) has the fault by comparing the traveling wave characteristic with the threshold for the mid-point of the section. The information regarding the threshold for the mid-point(s) can be determined in a manner similar to junctions as described hereinabove. Alternately, the junction threshold values can be interpolated according to characteristics of the section to arrive at the threshold value for the mid-points.

IED 14 may identify the fault section using other methods such as impedance based methods, voltage/current based methods or other travelling wave methods.

Once the line section with the fault has been identified, IED 14 determines location of the fault in the section. For this, the IED generates two or more estimates for the location of the fault. The IED utilizes a time difference between arrival of two peaks (for example difference between arrival of first and second peak), along with the line section lengths and wave propagation velocities to generate the two or more estimates.

In case of a two section mixed line system as shown in FIG. 1, where the first section (first line section) is an overhead line section (OHL) and the second section (second line section) is an underground cable section (UGC), there are four possibilities of location of occurrence of fault: fault in first half of first section, fault in second half of first section, fault in first half of second section and fault in second half of second section. Depending on the section, the IED can generate two or more estimates for the location of the fault, i.e. for the two halves of the section (which can be OHL or UGC).

The IED also generates a value for a threshold for the location of the fault. The IED may generate the value by calculating a fault location using an impedance based method. For instance, the fault location may be estimated based on voltage and current measurements along with line and source impedances. The threshold may have a single value (i.e. the fault location as estimated) or a range of values estimated taking into consideration the estimated fault location and estimation and/or measuring errors.

In an implementation, the IED selects an estimate of the two or more estimates as the location of the fault based on comparison of each estimate with a threshold for the location of the fault. For example, the IED can select the estimate which is closest to the threshold as the fault location. In another implementation, the IED determines the location of the fault by taking an average of the two or more estimates.

Figure 2:
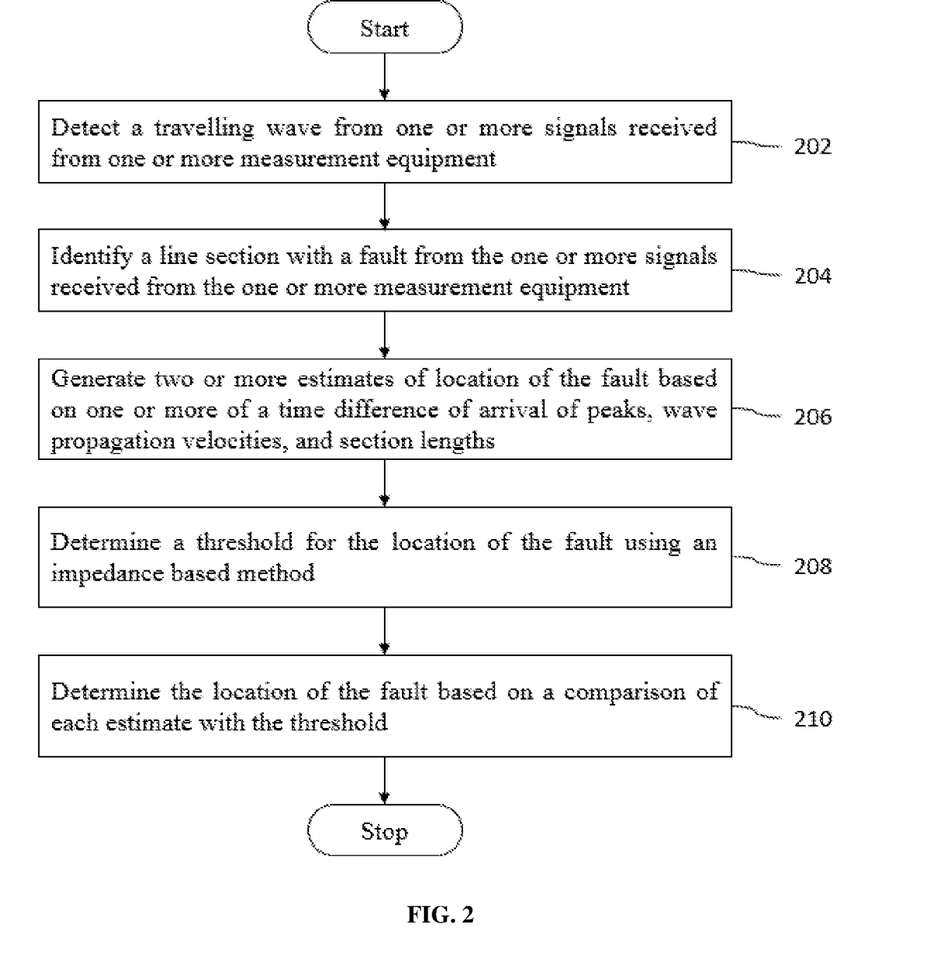
FIG. 2 is a flowchart of a method for locating the fault in the mixed power transmission line.

Referring to FIG. 2, which illustrates a flowchart of a method for locating the fault in the mixed power transmission line (such as mixed line described in conjunction with FIG. 1). The method is implemented by an IED (such as IED 14).

At 202, the IED detects a travelling wave from the one or more signals received from the one or more measurement equipment. The IED digitizes and processes the signal(s) to detect the travelling wave (refer para 0027). Thereafter, the IED identifies a section (line section) with a fault from the one or more signals. For example, the IED can identify the section with the fault based on travelling wave characteristics (refer para 0028). Alternately, the IED may use other single-ended travelling wave or impedance based methods for identifying the section with the fault.

According to the line section identified at 204, the IED generates two or more estimates of the location of the fault at 206. For generating the estimates, the IED may determine a time difference between arrival of two peaks of the travelling wave. For instance, the IED can determine the time difference between arrival of the first and the second peaks of the travelling wave. The IED utilizes the time difference information along with wave propagation velocities and section lengths for generating two or more estimates for the location of the fault.

At 208, a threshold for the location of the fault is estimated by the IED (for example by using an impedance based method). The threshold is estimated based on the one or more signals, equivalent source impedance of each source of the mixed line, and total line impedance of the mixed line. For example, the threshold may be estimated based on voltage and current measurements along with line and source impedances.

Also, the threshold for the location of the fault can be a single value, or a range of values for the location of the fault.

At 210, the IED determines the location of the fault based on a comparison of each estimate of the two or more estimates with the threshold. For example, the IED selects an estimate of the two or more estimates as the location of the fault based on a comparison of each of the two or more estimates with the threshold for the location of the fault. Taking another example, the IED takes an average of the two or more estimates to arrive at the location of the fault.

The following describes exemplary implementations of the method, in accordance with various embodiments of the invention.

Figure 3:
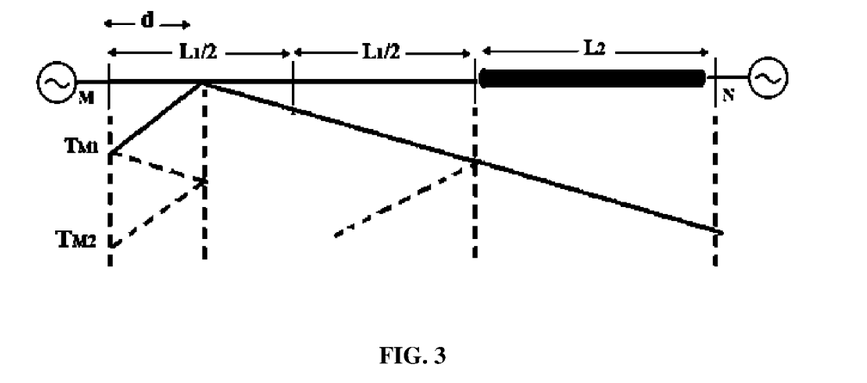
FIGS. 3-6 illustrate various Bewley-Lattice diagrams showing travelling waves created by the fault.

Assume that a fault has occurred in the first half of the first section (first line section) of the mixed line of FIG. 1. FIG. 3 illustrates the Bewley-lattice diagram showing the travelling waves created by the fault in the first half. In accordance with the method, the time $T_{M1}$ and $T_{M2}$ (the time corresponding to when the reflection from the fault or remote terminal reaches terminal M) are used to estimate the fault location.

For a fault in the first half of the first section, from FIG. 3, the following relationship can be derived:

$$T_{M1} = t_0 + \frac{d}{v_1} \qquad \text{equation (1)}$$

$$T_{M2} = t_0 + \frac{3 \times d}{v_1} \qquad \text{equation (2)}$$

In equations (1) and (2), $t_0$ is the time of origination of the travelling wave, $T_{M1}$ is the time of arrival of the first peak of the travelling wave, $T_{M2}$ is the time of arrival of the second peak, d is the location of the fault and $v_1$ is the wave propagation velocity in the first section. Upon subtracting equation (2) from (1), the fault location 'd' can be determined:

$$T_{M2} - T_{M1} = \frac{2 \times d}{v_1} \qquad \text{equation (3)}$$

$$d = \frac{(T_{M2} - T_{M1}) \times v_1}{2} \qquad \text{equation (4)}$$

Figure 4:
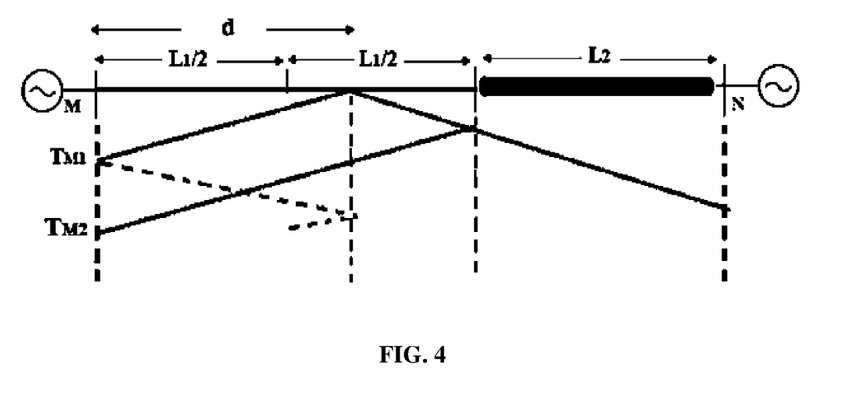

Now, consider a fault in the second half of the first section (see FIG. 4) of the mixed line system, the following equations can be obtained:

$$T_{M1} = t_0 + \frac{d}{v_1} \qquad \text{equation (5)}$$

$$T_{M2} = t_0 + \frac{L_1 - d}{v_1} + \frac{L_1}{v_1} \qquad \text{equation (6)}$$

In equation (6), $L_1$ is the length of the first section. The fault location d in this case (i.e. in the second half of the first section) can be obtained by subtracting equation (6) from (5):

$$T_{M2} - T_{M1} = \frac{2L_1 - 2d}{v_1} \qquad \text{equation (7)}$$

$$d = L_1 - \frac{(T_{M2} - T_{M1}) \times v_1}{2} \qquad \text{equation (8)}$$

Figure 5:
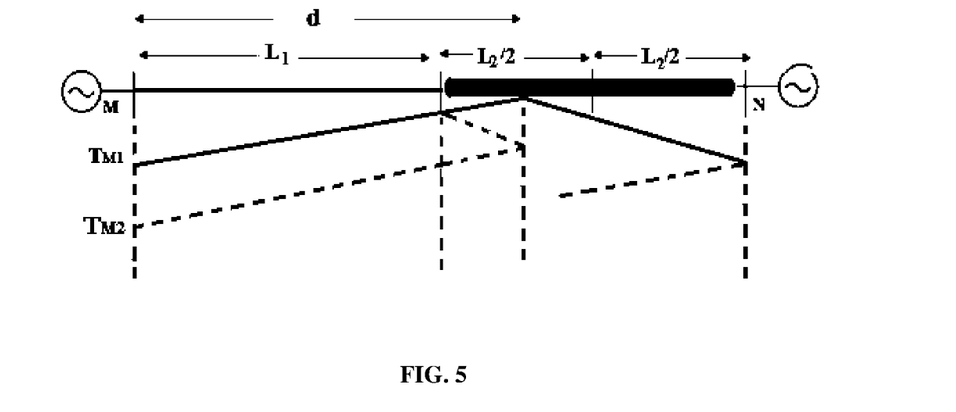

Consider a fault in the first half of the second section (second line section) (see FIG. 5) of the mixed line system, the following equations can be obtained:

$$T_{M1} = t_0 + \frac{d - L_1}{v_2} + \frac{L_1}{v_1} \qquad \text{equation (9)}$$

$$T_{M2} = t_0 + \frac{d - L_1}{v_2} + \frac{L_1}{v_1} + 2 \times \left(\frac{d - L_1}{v_2}\right) \qquad \text{equation (10)}$$

In equations (9) and (10) $v_2$ is the velocity of propagation of the travelling wave in the second section. The fault location d can be arrived at by subtracting equation 10 from 9:

$$T_{M2} - T_{M1} = 2 \times \left(\frac{d - L_1}{v_2}\right) \qquad \text{equation (11)}$$

$$d = L_1 + \frac{(T_{M2} - T_{M1}) \times v_2}{2} \qquad \text{equation (12)}$$

Figure 6:
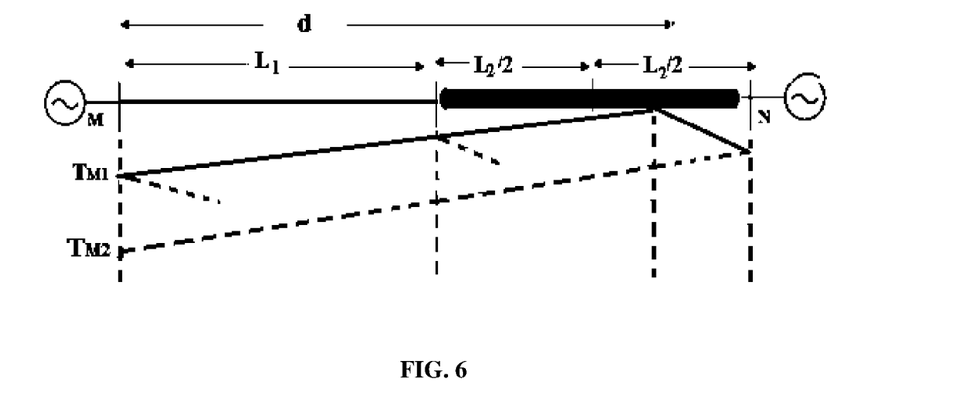

In case of a fault in the second half of the second section (see FIG. 6), the following equations can be obtained:

$$T_{M1} = t_0 + \frac{d - L_1}{v_2} + \frac{L_1}{v_1} \qquad \text{equation (13)}$$

$$T_{M2} = t_0 + \frac{L_1 + L_2 - d}{v_2} + \frac{L_1}{v_1} + \frac{L_2}{v_2} \qquad \text{equation (14)}$$

In equation (14) L2 is the length of the second section. The fault location d can be arrived at by subtracting equation 14 from 13:

$$T_{M2} - T_{M1} = 2 \times \left(\frac{L_1 + L_2 - d}{v_2}\right) \qquad \text{equation (15)}$$

$$d = L_1 + L_2 - \frac{(T_{M2} - T_{M1}) \times v_2}{2} \qquad \text{equation (16)}$$

For an n-section mixed line transmission system, the generalized fault location equations are as shown in equations 17 and 18 below. When the fault has occurred in the first half of section s, the fault location is given by:

$$d\_\text{first half} = \sum_{i=1}^{s-1} l_i + \frac{\Delta T_m \times v_s}{2} \qquad \text{equation (17)}$$

For a fault in the second half of section s, the fault location is given by:

$$d\_\text{second half} = \sum_{i=1}^{s} l_i - \frac{\Delta T_m \times v_s}{2} \qquad \text{equation (18)}$$

In equations 17 and 18, $\Delta T_m = T_{M2} - T_{M1}$; $l_i$ is the length of the $i^{th}$ section of the n-section mixed transmission line system in kilometers; and $v_i$ is the wave propagation velocity in the $i^{th}$ section in kilometers/second.

It can be observed from equations 17 and 18 that, the equations for fault location using the one-end travelling wave method, is different for faults in the first half of the line section and for faults in the second half of the line section. This indicates that the knowledge about which half of the line section is faulted, is required for the one-terminal travelling wave method for fault location to work alone efficiently. Hence in order to facilitate the selection of the correct fault location from among the candidate locations, an impedance based method for fault location is also used in combination with the travelling wave method explained in the previous section.

Figure 7:
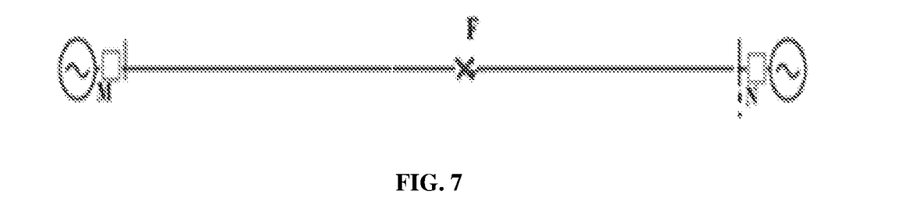
FIG. 7 shows a simplified diagram of the power transmission line with the fault at point F.
Figure 8:
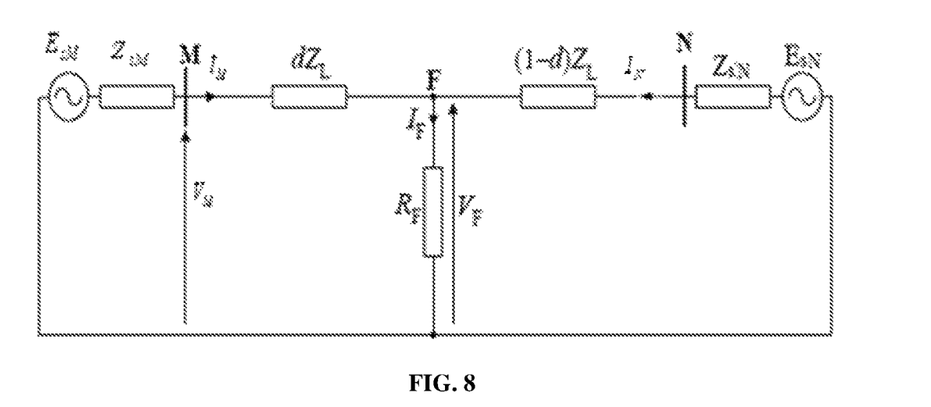
FIG. 8 shows an equivalent circuit of the power transmission line during the fault.

The impedance-based method is used to create a threshold (fault zone), such that the fault location among the candidate locations, which falls into this fault zone, can be selected as the final output location. Consider a transmission line system as shown in FIG. 7. The fault occurs at the point F, which is half way between the source end terminal M and the remote end terminal N. The equivalent circuit of the line impedances during the fault is as shown in FIG. 8. In the equivalent circuit, $E_{sM}$ and $E_{sN}$ are the equivalent sources at buses M and N respectively, $Z_{sM}$ and $Z_{sN}$ are equivalent source impedances of the two sources at M and N respectively, $Z_L$ is the total series line impedance matrix of the line MN, F is the fault point on line MN, at a distance 'd' from bus M, in kilometers, $R_F$ is the resistance of the fault path, assumed to be a purely resistive, $I_F$ is the fault current and $V_M$ and $I_M$ are fundamental components of the voltage and current measurements at bus M during fault. The voltage/current measurements may be obtained by applying a Fourier transform on the voltage and current measurements obtained from IED1 at bus M.

Figure 9:
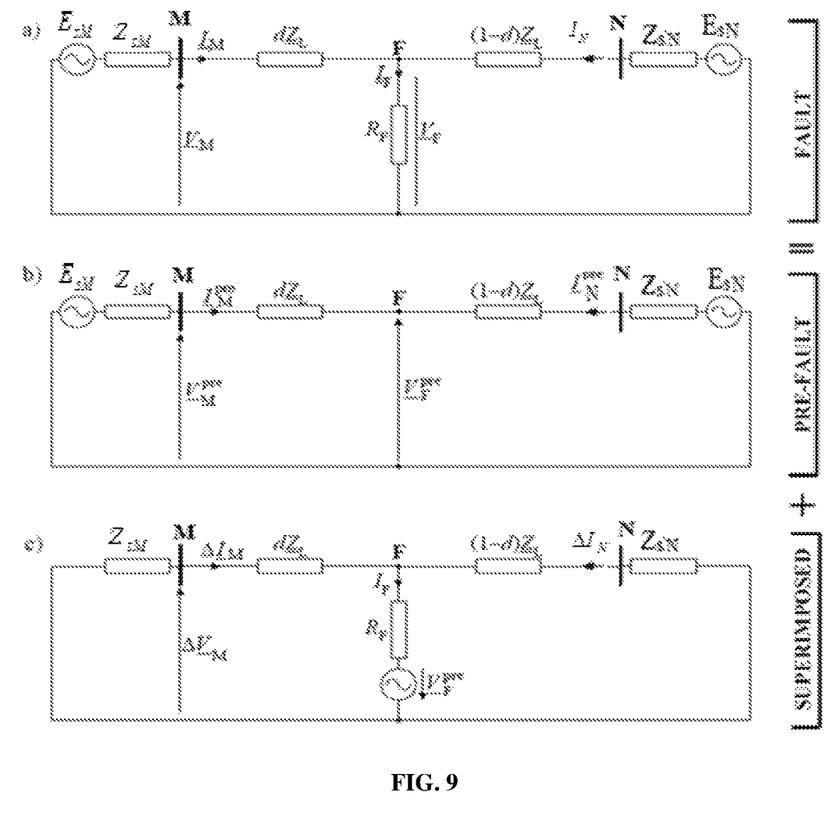
FIG. 9 shows the post-fault circuit as well as the pre-fault and the pure-fault/superimposed circuit.

Using superposition theorem, the post-fault circuit of the transmission system, can be split into pre-fault and pure-fault/superimposed circuits as shown in FIG. 9. Applying Kirchoff's voltage law (KVL) to the two meshes in the pure-fault equivalent circuit, the following two equations can be formed:

$$\Delta I_M(Z_{sM}+dZ_L)+R_F I_F = V_F^{pre} \quad \text{equation (19)}$$

$$\Delta I_N(Z_{sN}+(1-d)Z_L)+R_F I_F = V_F^{pre} \quad \text{equation (20)}$$

In the above $\Delta I_M = I_M - I_M^{pre}$ and all the variables with superscript 'pre' are the corresponding pre-fault values. Since the accurate source impedance magnitudes are typically not available, $E_{sM}$ and $Z_{sN}$ are calculated by system studies of the particular system. Alternately, $Z_{sM}$ and $Z_{sN}$ can be provided as IED settings. Solving the equations 19 and 20, $\Delta I_N$ can be written as a function of $\Delta I_M$ and the source and line impedances.

$$\Delta I_N = \frac{(Z_{sM}+dZ_L)}{(Z_{sN}+(1-d)Z_L)} \Delta I_M \quad \text{equation (21)}$$

From the equivalent circuit of the post-fault system, applying Kirchhoff's voltage law in the first mesh the following equation can be derived:

$$V_M - dZ_L I_M - I_F R_F = 0 \quad \text{equation (22)}$$

In equation 22, $I_F = \Delta I_N + \Delta I_M$. Substituting for $\Delta I_N$ from equation 21:

$$I_F = \Delta I_M \left( 1 + \frac{(Z_{sM}+dZ_L)}{(Z_{sN}+(1-d)Z_L)} \right) \quad \text{equation (23)}$$

Now, separating the equation 23 into real and imaginary parts, the following two linear equations in terms of two unknowns, d and $R_F$ are obtained:

$$V_M - dZ_L I_M - \Delta I_M(1+\alpha)R_F = 0 \quad \text{equation (24)}$$

$$\alpha = \frac{Z_{sM}+dZ_L}{Z_{sN}+(1-d)Z_L} \quad \text{equation (25)}$$

Equation 24 can be solved using any numerical method to obtain the fault distance, d in kilometers. In the case of multi-section lines, using the fault section information available, the impedance based method can be applied to the faulted section alone. The voltages and currents shall be accordingly replaced by the junction voltages and junction currents as calculated.

There may be an error in the fault location results from the impedance-based method. For instance, there may be an error of less than 10% of the total length of the line, under various system conditions. This information may be used to deduce the fault zone (threshold) from the impedance based method result. The minimum and maximum limits of the fault zone can be calculated from the equations below:

Fault zone minimum limit=(Impedance method output)−(0.1*Total line length)

Fault zone maximum limit=(Impedance method output)+(0.1*Total line length)

After the line section with the fault is identified, the travelling wave method gives two candidate fault locations, one corresponding to the first half of the line section with the fault and the second corresponding to the second half of the line section with the fault. The impedance based method is used in combination with the travelling wave method, in order to solve the problem of selection of the correct fault location from among the candidate fault locations. As explained hereinabove, the impedance method gives a fault zone (threshold), which can be used to eliminate the wrong fault location, from among the two candidate locations. The location which falls into the fault zone defined by the impedance method is selected as the final fault location. In the case, where both the candidate locations fall into the fault zone, the one which is closest to the impedance method output is selected as the final fault location. Alternately, an average of the candidate locations can be taken to determine the fault location.

Consider a test case where the fault is located at 109 kilometers. The candidate locations from the travelling wave method are 109.012 and 110.988 kilometers. The fault location calculated using impedance based method is 106 kilometers. The fault zone identified is between 100 and 112 kilometers (i.e. from (106−6) to (106+6)). Obviously, both the candidate locations fall into the fault zone. In this case, the location closer to the output of the impedance based method (106 kilometers), i.e., 109.012 kilometers is selected as the final fault location.

As an alternative to using the impedance based method, the fault sub-section information can be used to determine the fault location. Here, as per the half of the section with the fault identified by the IED, the corresponding fault location equation can be applied. For example, the IED may identify that the second half of the second section has the fault. Accordingly, the fault location equation (i.e. equation 16) can be used for locating the fault.

Thus, the invention utilizes the advantages of both the travelling wave based method and the impedance based method, to form a very efficient and highly accurate fault locator for mixed line transmission systems.

The invention claimed is:

1. A method for locating a fault in a mixed power transmission line comprising two or more line sections, the method comprising:

receiving, by an Intelligent Electronic Device (IED) of the mixed power transmission line, one or more signals from one or more measurement equipment connected to the mixed power transmission line;

detecting, by the IED, a travelling wave from the one or more signals received from the one or more measurement equipment, wherein the travelling wave is generated due to the fault in a line section where the fault is located of the two or more line sections;

identifying, by the IED, the line section where the fault is located from the one or more signals received from the one or more measurement equipment, including determining a first peak of the travelling wave and at least one travelling-wave characteristic of the first peak chosen from a peak width, a rise time, and a discharge time and comparing the at least one travelling-wave characteristic of the first peak with a corresponding threshold value for each junction of one or more junctions that connect consecutive line sections of the two or more line sections of the mixed power transmission line, wherein the corresponding threshold value for each junction is predetermined for each junction of the one or more junctions and is stored in the IED;

generating, by the IED, two or more estimates of a location of the fault within the line section where the fault is located, wherein each estimate of the two or more estimates is generated based on a time difference between arrival of two peaks of the travelling wave, a velocity of propagation of the travelling wave in the line section where the fault is located t, and a length of one or more line sections of the two or more line sections; and determining, by the IED, the location of the fault within the line section where the fault is located based on a comparison of each estimate of the two or more estimates with a threshold for the location of the fault, wherein the threshold for the location of the fault is estimated based on the one or more signals, equivalent source impedance of each of multiple sources of the mixed power transmission line, and total line impedance of the mixed power transmission line.

2. The method of claim 1, wherein the two peaks of the travelling wave comprise the first peak of the travelling wave and a second peak of the travelling wave respectively.

3. The method of claim 1, wherein determining the location of the fault comprises selecting an estimate of the two or more estimates that is closest to the threshold for the location of the fault.

4. The method of claim 1, wherein a first estimate of the two or more estimates corresponds to a first half of the line section where the fault is located, and a second estimate of the two or more estimates corresponds to a second half of the line section where the fault is located.

5. The method of claim 1, further comprising estimating the threshold for the location of the fault based on voltage and current measurements obtained from the one or more measurement equipment, equivalent source impedance of each source of the mixed power transmission line, and total line impedance of the mixed power transmission line.

6. The method of claim 1, wherein the threshold for the location of the fault comprises a single value for the location of the fault or a range of values for the location of the fault.

7. The method of claim 6, further comprising determining the range of values for the location of the fault based on an estimation error, a measurement error, or both.

8. The method of claim 6, wherein determining the location of the fault within the line section where the fault is located based on the comparison of each estimate of the two or more estimates with the threshold for the location of the fault comprises determining each estimate of the two or more estimates that is within the range of values.

9. The method of claim 8, wherein determining the location of the fault within the line section where the fault is located based on the comparison of each estimate of the two or more estimates with the threshold for the location of the fault further comprises determining the location of the fault based on each estimate of the two or more estimates that is within the range of values.

10. A method comprising:
detecting, by an Intelligent Electronic Device (IED), a travelling wave from one or more signals received from one or more measurement equipment of a mixed power transmission line;
identifying, by the IED, a line section of the mixed power transmission line having a fault by comparing a characteristic of the travelling wave with a corresponding threshold for each junction of a plurality of junctions of the mixed power transmission line;
generating, by the IED and based on the identified line section and a time difference between arrival of two peaks of the travelling wave, at least two estimates of a location of the fault within the identified line section; and
determining, by the IED, the location of the fault within the identified line section by comparing the at least two estimates of the location of the fault to a reference location determined as a function of a total line impedance of the mixed power transmission line.

11. The method of claim 10, wherein comparing the characteristic of the travelling wave with the corresponding threshold for each junction of the plurality of junctions comprises comparing a peak width of a peak of the travelling wave with a corresponding threshold value for each junction of the plurality of junctions.

12. The method of claim 10, wherein comparing the characteristic of the travelling wave with the corresponding threshold for each junction of the plurality of junctions comprises comparing a rise time of a peak of the travelling wave with a corresponding threshold value for each junction of the plurality of junctions.

13. The method of claim 10, wherein comparing a characteristic of the travelling wave with a corresponding threshold for each junction of the plurality of junctions comprises comparing a discharge time of a peak of the travelling wave with a corresponding threshold value for each junction of the plurality of junctions.

14. The method of claim 10, wherein detecting the travelling wave from the one or more signals comprises:
applying a Clark transformation to the one or more signals;
obtaining aerial mode components and ground mode components from the one or more signals;
filtering out, as a function of the aerial mode components, noise from the one or more signals; and
extracting the travelling wave from a predetermined frequency band of the one or more signals.

15. The method of claim 14, further comprising extracting a travelling wave from each phase of a multiphase alternating current signal.

16. The method of claim 10, wherein determining the location of the fault within the identified line section by comparing the at least two estimates of the location of the fault to the reference location determined as the function of the total line impedance of the mixed power transmission line comprises selecting, as the location of the fault within the identified line section, an estimate of the location that is closest to the reference location.

17. The method of claim 10, wherein the reference location is further determined by impedances of sources connected to the mixed power transmission line.

18. The method of claim 17, further comprising determining, by the IED, a range of reference locations of the fault based on one or more measuring errors.

19. A device comprising:
circuitry to:
detect a travelling wave from one or more signals received from one or more measurement equipment of a mixed power transmission line;
identify a line section of the mixed power transmission line having a fault by comparing a characteristic of the travelling wave with a corresponding threshold for each of a plurality of junctions of the mixed power transmission line;

generate, based on the identified line section and a time difference between arrival of two peaks of the travelling wave, at least two estimates of a location of the fault within the identified line section; and determine the location of the fault within the identified line section by comparing the at least two estimates of the location of the fault to a reference location determined as a function of a total line impedance of the mixed power transmission line.

20. The device of claim 19, wherein the location of the fault is determined by selecting an estimate of the at least two estimates that is closest to the reference location.

\* \* \* \* \*